United States Patent [19]

Ballou

[11] Patent Number: 4,671,204

[45] Date of Patent: Jun. 9, 1987

[54] LOW COMPLIANCE SEAL FOR GAS-ENHANCED WAFER COOLING IN VACUUM

[75] Inventor: Jon M. Ballou, Danvers, Mass.

[73] Assignee: Varian Associates, Inc., Palo Alto, Calif.

[21] Appl. No.: 864,097

[22] Filed: May 16, 1986

[51] Int. Cl.$^4$ .......................... F28F 9/00; B05C 13/02
[52] U.S. Cl. ...................................... 118/59; 118/503; 165/80.4
[58] Field of Search ................ 118/59, 724, 728, 503, 118/50, 733; 269/21, 26; 165/80.2, 80.4, 80.5; 250/440.1, 443.1

[56] References Cited

U.S. PATENT DOCUMENTS

| | | | |
|---|---|---|---|
| 4,282,924 | 8/1981 | Faretra | 118/500 |
| 4,457,359 | 7/1984 | Holden | 269/26 X |
| 4,542,298 | 9/1985 | Holden | 250/440.1 X |

*Primary Examiner*—John P. McIntosh

*Attorney, Agent, or Firm*—Stanley Z. Cole; Edward H. Berkowitz; Terrence E. Dooher

[57] ABSTRACT

Apparatus for thermal transfer with a semiconductor wafer in a vacuum processing chamber includes a platen with a surface for supporting the wafer, a clamping ring for clamping the wafer to the platen, and passages for supplying a low pressure gas into a thermal transfer region between the wafer and the platen surface. A low compliance seal surrounds the thermal transfer region and inhibits the gas from reaching the processing chamber without overstressing the wafer. The seal includes an elastomer ring having an elongated cross-section, and a sealing groove having a first groove portion for gripping one edge of the ring and a second groove portion which receives the other edge of the ring by bending deformation thereof when a wafer is clamped to the platen. In a preferred embodiment, the ring has a parallelogram-shaped cross-section and is oriented at an acute angle to the platen surface.

12 Claims, 5 Drawing Figures

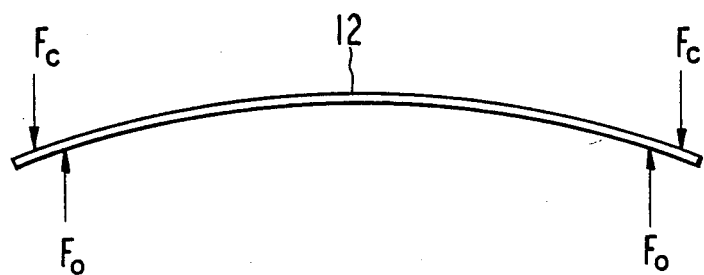
FIG_2
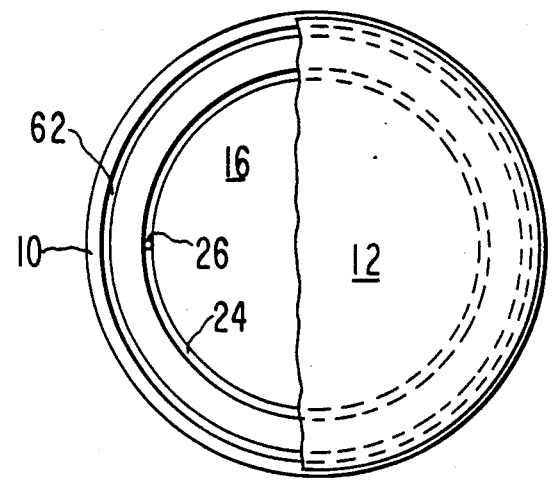
FIG.4

LOW COMPLIANCE SEAL FOR GAS-ENHANCED WAFER COOLING IN VACUUM

FIELD OF THE INVENTION

This invention relates to processing of workpieces in a vacuum chamber and, more particularly, to apparatus for thermal transfer in a system for processing of semiconductor wafers which utilizes gas as a transfer medium.

BACKGROUND OF THE INVENTION

In the fabrication of integrated circuits, a number of processes have been established which involve the application of high energy beams onto semiconductor wafers in vacuum. These processes include ion implantation, ion beam milling and reactive ion etching. In each instance, a beam of ions is generated in a source and directed with varying degrees of acceleration toward a target. Ion implantation has become a standard technique for introducing impurities into semiconductor wafers. Impurities are introduced into the bulk of semiconductor wafers by using the momentum of energetic ions as a means of imbedding them in the crystalline lattice of the semiconductor material.

As energetic ions impinge on a semiconductor wafer and travel into the bulk, heat is generated by the atomic collisions. This heat can become significant as the energy level, or current level, of the ion beam is increased and can result in uncontrolled diffusion of impurities beyond prescribed limits. As device geometries become smaller, this uncontrolled diffusion becomes less acceptable. A more severe problem with heating is the degradation of patterned photoresist layers which are applied to semiconductor wafers before processing and which have relatively low melting points.

In commercial semiconductor processing, a major objective is to achieve a high throughput in terms of wafers processed per unit time. One way to achieve high throughput in an ion beam system is to use a relatively high current beam. However, large amounts of heat may be generated in the wafer. Thus, it is necessary to cool the wafer in order to prevent elevated temperatures from being attained.

Techniques for keeping the wafer temperature below a prescribed limit have included batch processing in which the incident power is spread over a number of wafers, time-shared scanning of the beam and conductive cooling through direct solid-to-solid contact between a wafer and a heat sink (see U.S. Pat. No. 4,282,924). The cooling efficiency of systems employing solid-to-solid contact is limited by the extent to which the back side of the wafer contacts the thermally conductive surface, since at the microscopic level, only small areas of the two surfaces (typically less than 5%) actually come into contact.

The technique of gas conduction is known to permit thermal coupling between two opposed surfaces and has been applied to semiconductor processing in vacuum. In one approach, gas is introduced into a cavity between a wafer and a support plate (see U.S. Pat. No. 4,264,762). The achievable thermal transfer with this approach, however, is limited since bowing of the wafer occurs at relatively low gas pressures.

Gas-assisted solid-to-solid thermal transfer with a semiconductor wafer is disclosed in U.S. Pat. No. 4,457,359, assigned to the assignee of the present application. A semiconductor wafer is clamped at its periphery onto a shaped platen, and gas under pressure is introduced into the microscopic void region between the platen and the wafer. The gas pressure approaches that of the preloading, clamping pressure without any appreciable increase in the wafer-to-platen spacing. Since the gas pressure is significantly increased without any increase in the wafer-to-platen gap, the thermal resistance is reduced and solid-to-solid thermal transfer with gas assistance produces optimum results. In both of these approaches, the gas is supplied from a gas source including means for regulating the pressure coupled to the thermal transfer region behind the wafer.

Regardless of the shape of the platen which supports the wafer, it is necessary to limit the flow of gas from the thermal transfer region into the vacuum processing chamber. An uncontrolled leak into the vacuum chamber will cause scattering of the ion beam and neutralizing collisions which can affect dose measurement accuracy. One way of inhibiting the flow of gas from the thermal transfer region is to position an elastomer O-ring in a groove in the platen surface near the periphery of the semiconductor wafer. When the wafer is clamped against the platen surface, the O-ring is compressed, thereby forming a peripheral seal around the thermal transfer region.

While the seal between the elastomer O-ring and the semiconductor wafer is generally satisfactory, it has certain disadvantages. The clamping ring for clamping the wafer against the platen surface is typically as close to the wafer periphery as practical, so that otherwise usable wafer area is not blocked by the clamping ring. The O-ring is located radially inward from the wafer edge and from the clamping ring to avoid overlapping the wafer flat. Thus, when the wafer is clamped in position, the O-ring exerts a force on the wafer which is opposite in direction to the clamping force and radially inward of the clamping force. As a result, the center portion of the wafer tends to be lifted, and the pressure between the wafer and the platen surface in the thermal transfer region is reduced. When lifting occurs, the rate of thermal transfer between the wafer and the platen surface is substantially reduced. Furthermore, the oppositely directed clamping and O-ring forces stress the semiconductor wafer and, in some cases, have overstressed wafers beyond the normally accepted limit of 8,000 psi causing wafer breakage. In addition, the wafer can stick to prior art O-rings, causing a highly undesirable interruption in processing to free the wafer.

In ion implantation systems, the depth of ion penetration into the semiconductor material depends in part on the orientation angle between the crystalline lattice of the semiconductor material and the ion beam. For certain angles, an undesirable effect known as channelling results in excessive ion penetration. When wafers are clamped to a curved or domed platen, the incident angle of the ion beam varies over the wafer surface, resulting in spatially variable channelling. It is desirable to avoid such spatially variable channelling by maintaining a constant angle of incidence between the wafer and the ion beam. However, the clamping and O-ring forces described above tend to deform the wafer into a dome, thereby exacerbating the channelling problem.

It is desirable to provide a means for sealing the thermal transfer region between the wafer and the platen surface without overstressing the wafer and without adversely affecting thermal transfer characteristics. U.S. Pat. No. 4,542,298, assigned to the assignee of the present application, discloses a technique for removal of gas escaping from the thermal transfer region before it reaches the high vacuum chamber. An intermediate region around the periphery of the wafer is vacuum pumped to a pressure below that of the gas in the thermal transfer region. This arrangement is disadvantageous in that a seal is required between the peripheral front surface of the wafer and the high vacuum chamber, thereby complicating the construction of the wafer processing station.

It is an object of the present invention to provide improved apparatus for thermal transfer with a thin, flexible workpiece in a vacuum chamber.

It is a further object of the present invention to provide improved apparatus for thermal transfer with a thin, flexible workpiece in a vacuum chamber wherein a thermal transfer gas is inhibited from reaching the high vacuum region.

It is a further object of the present invention to provide apparatus for thermal transfer with a thin, flexible workpiece in a vacuum chamber without overstressing the workpiece.

Summary of the Invention

According to the present invention, these and other objects and advantages are achieved in apparatus for thermal transfer with a thin, flexible workpiece during processing a vacuum chamber comprising platen means including a platen surface for supporting the workpiece in a processing position with a surface exposed to the vacuum chamber, means for clamping the workpiece to the platen surface, means for introduction of a gas at a prescribed pressure into a thermal transfer region between the workpiece and the platen surface and means for inhibiting flow of gas from the thermal transfer region to the vacuum chamber. The gas flow inhibiting means comprises an elastomer ring having an elongated cross-section and a sealing groove in the platen surface near the periphery of the wafer and surrounding the thermal transfer region. The groove includes a first groove portion for firmly gripping a fixed edge portion of the ring so that a movable edge portion of the ring extends above the platen surface and contacts the workpiece. The elongated cross-section has a long dimension oriented at an acute angle to the platen surface. The sealing groove further includes a second groove portion which receives the movable edge portion of the ring by bending deformation thereof when the workpiece is clamped to the platen surface.

It is preferred that the elongated cross-section of the elastomer ring have a parallelogram shape and taper essentially to a point where the ring contacts the workpiece. It is further preferred that the first groove portion include parallel sidewalls spaced to firmly grip opposite sides of the fixed edge portion of the ring, the sidewalls being oriented at an acute angle to the platen surface.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIG. 2 is a free-body diagram illustrating the forces exerted on a wafer in the apparatus of FIG. 1;

FIG. 4 is a plan view, partially cut away, of a wafer on the platen surface in accordance with the present invention.

DETAILED DESCRIPTION OF THE INVENTION

Figure 1:
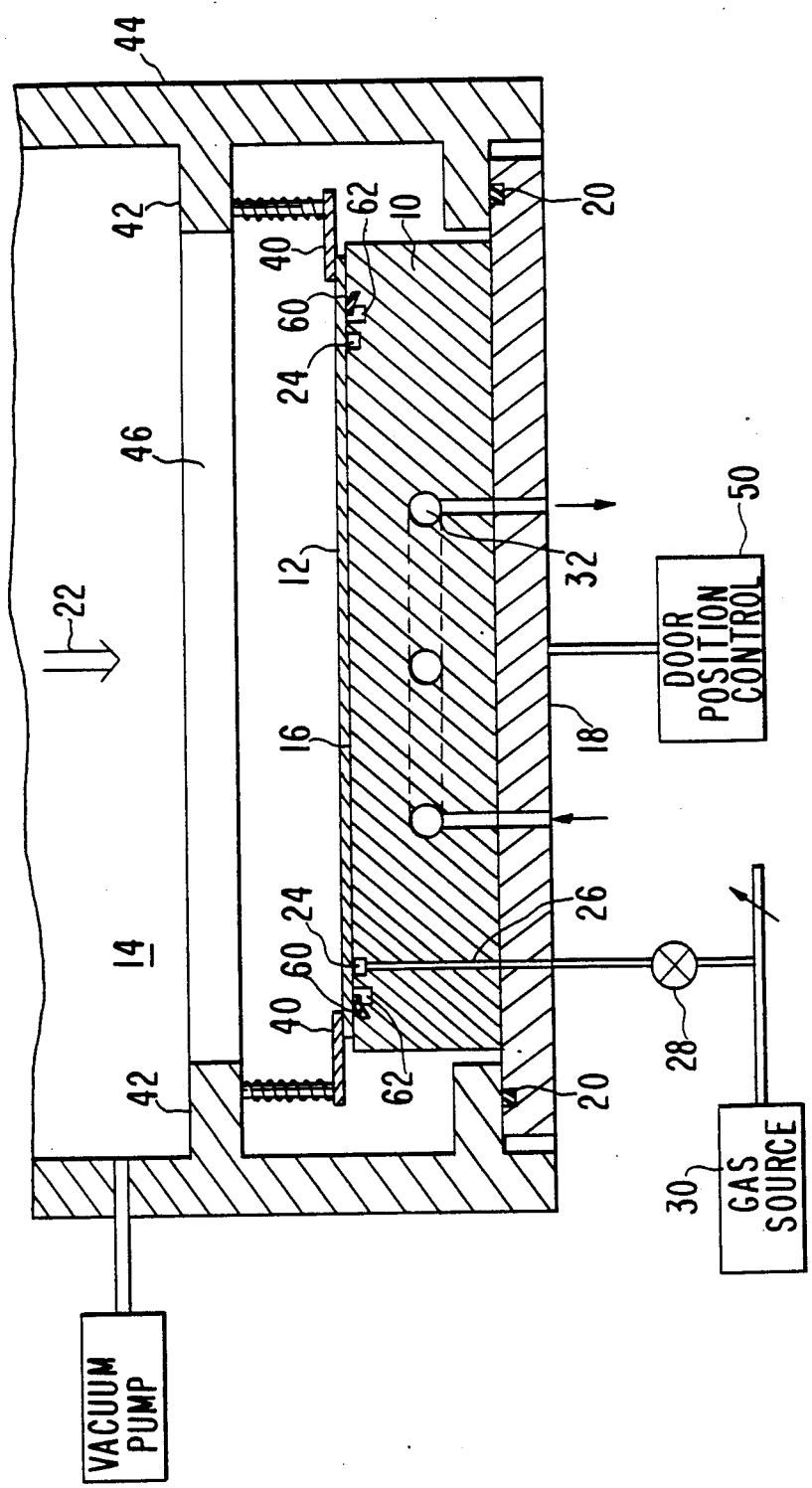
FIG. 1 is a cross-sectional view of apparatus for gas-enhanced thermal transfer with a semiconductor wafer in accordance with the present invention.

Apparatus for gas-enhanced thermal transfer with a semiconductor wafer in accordance with the present invention is shown in simplified form in FIG. 1. The apparatus can be utilized in an ion implantation system such as the Model 350D Ion Implantation System manufactured and sold by the Extrion Division of Varian Associates, Inc. The target region of the ion implantation system is illustrated in FIG. 1. A platen 10 provides support for a semiconductor wafer 12 in a processing position with its front surface exposed to a vacuum chamber 14. The platen 10 is typically a metal, such as aluminum, and includes a platen surface 16 which can be domed or curved as described in U.S. Pat. Nos. 4,282,924 and 4,535,835, both assigned to the assignee of the present invention. Alternatively, the platen surface 16 can be flat. In FIG. 1 the platen surface 16 is shown as flat, although it will be understood that any curvature is relatively slight. When the wafer 12 is clamped against a curved platen surface 16, it is deflected to conform to the surface 16. The contour of the platen surface 16 is selected to insure intimate contact between the wafer 12 and surface 16. The platen 10 can be attached to or can be part of a chamber door 18. An O-ring 20 on the chamber door 18 seals the platen 10 into the vacuum chamber 14.

During processing, an ion beam 22 impinges on the wafer 12 and generates heat therein. The wafer 12 is in contact with the curved platen surface 16 in order to remove the heat by conduction. However, as noted above, the back surface of the wafer 12 and the platen surface 16 actually make contact over less than 5% of the total area due to microscopic surface irregularities. Numerous microscopic voids exist between the actual points of contact. When these voids are evacuated heat conduction is greatly reduced. To alleviate this problem, a gas such as air at a prescribed pressure is introduced into the microscopic voids by means of an annular groove 24 in the surface 16 coupled to a passage 26. The passage 26 is coupled through a shutoff valve 28 to a gas source 30 at a prescribed pressure which is typically in the range between 1 torr and 50 torr. The gas-filled microscopic voids comprise a thermal transfer region which conducts heat between the wafer 12 and the platen 10. Further details on the technique of gas-enhanced thermal transfer are disclosed in U.S. Pat. No. 4,457,359. The platen 10 can be provided with passages 32 for circulation of a coolant such as water.

A spring-loaded clamping ring 40 is attached to a flange 42 which is part of housing 44 which encloses the vacuum chamber 14. When the platen 10 is in the processing position, the clamping ring 40 securely clamps the wafer 12 against the platen surface 16. Typically the vacuum chamber 14 and the platen 10 are separated by a vacuum gate valve 46, thereby defining an air lock which permits wafers to be exchanged without venting the vacuum chamber 14. The chamber door 18 and the platen 10 are coupled to a position control means 50 which is operative to open the door 18 from the wafer processing position to a wafer transfer position in which wafers are exchanged. The control means 50 can, for example, be an air cylinder.

In accordance with the present invention, the apparatus shown in FIG. 1 is provided with a seal between the thermal transfer region and the vacuum chamber 14. The seal comprises an elastomer ring 60 located in a groove 62. The seal has unique characteristics which permit the thermal transfer region to be effectively sealed from the vacuum chamber 14 without subjecting the wafer 12 to excessive stress. The characteristics of the elastomer ring 60 and the groove 62 are described in detail hereinafter. The groove 62 extends around the platen surface 16 inside the periphery of the wafer 12 and forms a closed loop which surrounds the thermal transfer region. The thermal transfer region is thus defined by the rear surface of the wafer 12, the platen surface 16 and the seal of the present invention. The groove 62 is located radially outward of annular groove 24 and is preferably as close to the periphery of the wafer 12 as is practical. When a circular elastomer ring 60 is utilized, it is necessary to position the groove 62 inward of the wafer flat to avoid leakage. When a specially designed elastomer ring having a flat corresponding to the wafer flat is utilized, the groove 62 can be located closer to the wafer periphery.

Referring now to FIG. 2, there is shown a free-body diagram of the forces exerted on the wafer 12 by the clamping ring 40 and the elastomer ring 60. In the typical situation, the clamping force $F_c$ is outward of the sealing ring force $F_o$. Each force is effectively a circular line force tending to depress the outer wafer edge and lift the center portion. In prior art systems, when conventional O-rings having circular cross-sections were utilized, excessive forces were applied to the wafer 12 resulting in stresses well above the 8000 psi limit and occasional wafer breakage. It has been determined that the line force exerted by prior art circular O-rings is on the order of 6 pounds per inch when a 70 durometer O-ring is compressed by 13.5%. In addition to the stress caused by these forces, lifting of the center portion of the wafer tends to substantially reduce thermal transfer characteristics.

In accordance with the present invention, the forces $F_o$ exerted by the elastomer sealing ring are substantially reduced while maintaining a reliable seal against leakage of gas from the thermal transfer region to the vacuum chamber 14. As seen in FIG. 1, gas leakage radially outward between the wafer 12 and the platen surface 16 flows directly to the vacuum chamber 14 causing a degradation in system performance as described hereinabove.

Figure 3A:
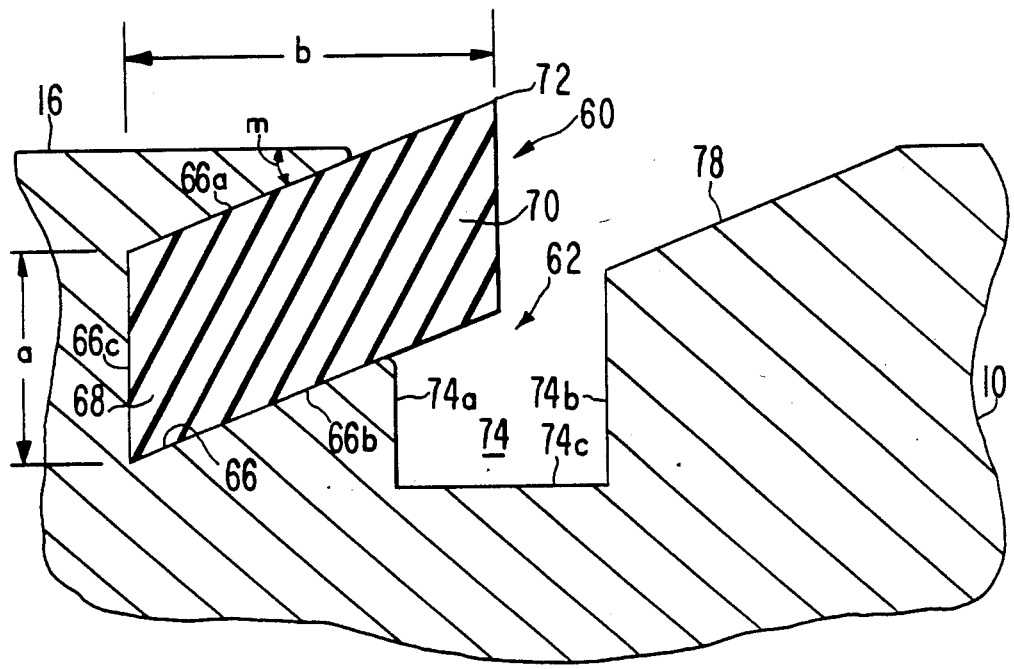
FIG. 3A is an enlarged cross-sectional view of the low compliance seal in accordance with the present invention with no wafer present.
Figure 3B:
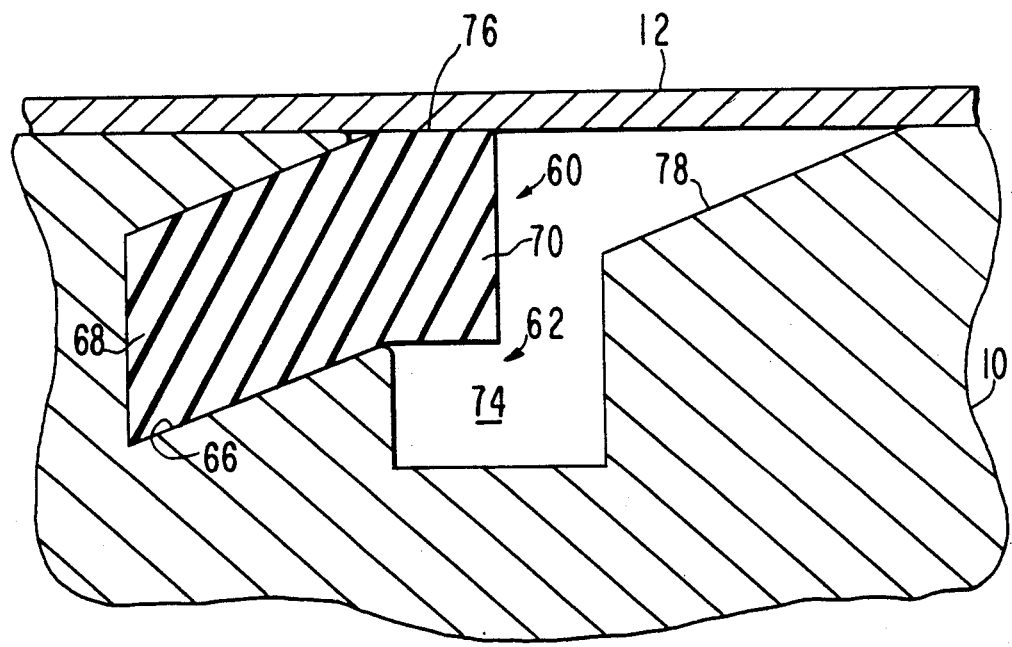
FIG. 3B is an enlarged cross-sectional view of the low compliance seal in accordance with the present invention with a wafer present on the platen surface.

A greatly enlarged cross-sectional view of the sealing means of the present invention with no wafer present is shown in FIG. 3A. A similar view is shown in FIG. 3B with a wafer 12 clamped to the platen surface 16. The elastomer ring 60 has an elongated cross-section and, in the present example, has a parallelogram shaped cross-section. The cross-section shown in FIG. 3A is uniform around the the ring 60. In a preferred embodiment, the ring 60 is 70 durometer viton, dimension a is 0.050 inch and dimension b is 0.125 inch.

The groove 62 includes a first groove portion 66 which firmly grips a fixed edge portion 68 of ring 60 so that a movable edge portion 70 of ring 60 extends above the platen surface 16 when no wafer is clamped thereto. Preferably, the ring 60 extends above the platen surface 16 with no wafer present by about 0.023 inch. The elongated cross-section of the ring 60 is positioned by the first groove portion 66 so that the long dimension of the elongated cross-section is oriented at acute angle m with respect to the platen surface 16. In the present example the angle m is 22 degrees. The first groove portion 66 includes parallel sidewalls 66a, 66b, both oriented at the angle m with respect to the platen surface 16 and a back wall 66c connecting walls 66a and 66b. The sidewalls 66a and 66b are spaced to firmly grip the fixed edge portion 68 of the ring 60. The movable edge portion 70 of the ring 60 tapers essentially to a point 72, when no wafer is clamped to the platen surface 16.

The groove 62 further includes a second groove portion 74 which receives the movable edge portion 70 of the ring 60 by bending deformation thereof when a wafer 12 is clamped to the platen surface 16 as shown in FIG. 3B. The second groove portion 74 is located adjacent the open end of the first groove portion 66 and includes sidewalls 74a, 74b and a bottom wall 74c.

The first groove portion 66 and the second groove portion 74 can be fabricated relatively easily on a lathe with appropriate tooling. The sloping portion 78 of platen surface 16 is not a necessary element of the present invention but is typically formed during machining of the first groove portion 66 and does not adversely affect the performance of the apparatus.

As seen in FIG. 3B, when the wafer 12 is clamped to the platen surface 16, the movable edge portion 70 of the ring 60 is pressed downwardly into the second groove portion 74, while the fixed edge portion 68 remains substantially fixed in position. As the movable edge portion 70 is depressed by the wafer 12, there is formed a contact area 76 which substantially seals the thermal transfer region and prevents gas leakage into the vacuum chamber 14. The depression of the movable edge portion 70 results primarily in a bending or deflection of the cross-section of the elastomer ring 60 and a lesser amount of compression. This provides a substantial reduction in the force applied by the ring 60 to the wafer 12, while maintaining efficient sealing of the thermal transfer region. The sealing arrangement of the present invention provides sufficient deflection of the ring 60 upon clamping of a wafer 12 to the platen surface 16 to overcome any irregularities, variations and tolerances and to reliably seal the thermal transfer region. However, since the ring 60 is deflected by bending, with very little compression, the force applied to the wafer is minimized and the undesirable effects described hereinabove are alleviated. In the above example, it has been found that a line loading of about 0.185 pounds per inch results. Therefore, wafer stress is greatly reduced in comparison with prior art sealing techniques.

It will be understood that the cross-section of the elastomer ring 60 is not necessarily a parallelogram in accordance with the present invention. An elongated cross-section is required to facilitate bending deformation as described above. In addition, the first groove portion is not necessarily shaped as shown and described hereinabove. It is required that the first groove portion be shaped to firmly grip one edge portion of the elastomer ring and to position it at an acute angle with respect to the platen surface 16 such that it extends above the platen surface 16 when no wafer is clamped thereto. In addition, the second groove portion is not necessarily shaped as shown and described hereinabove. It is required that the second groove portion provide a space for deflection of the movable edge portion of the ring by bending deformation with minimal compression.

In operation the chamber door 18 is opened and the wafer 12 is placed on the platen surface 16 and is temporarily retained thereon by a vacuum chuck (not shown) until the door 18 is closed. When the door 18 is closed, the clamping ring 40 bears against the wafer 12 around its outer periphery and securely clamps the wafer against the platen surface 16. After the door 18 is sealed, the air lock defined by the vacuum gate valve 46 is vacuum pumped and the gate valve 46 is opened. The shutoff valve 28 is opened, thereby permitting introduction of gas at the prescribed pressure into the thermal transfer region between the wafer 12 and the platen surface 16. Ion implantation of the wafer 12 now proceeds by scanning of the ion beam 22 over the surface of the wafer 16. Heat imparted to the wafer 12 by the ion beam 22 is transferred to the platen 10 by the gas in the thermal transfer region and by direct conduction at the points of physical contact. The heat is then removed from the platen 10 by the coolant circulating through the passages 32. The clamping ring 40 clamps the wafer 12 against the platen surface 16, thereby deforming the elastomer ring 60, as shown in FIG. 3B, and restricting the flow of the thermal transfer gas from the thermal transfer region into the vacuum chamber 14.

The present invention has been described in connection with serial process ion implantation systems, that is, ion implantation systems wherein one wafer at a time is processed by electrostatic scanning. It will be understood that the sealing means of the present invention can be applied to batch type ion implantation systems wherein a plurality of wafers is mounted on a rotating disk for processing. Also, the sealing means is applicable generally to any type of wafer processing in vacuum wherein thermal transfer is required. In addition, the apparatus has been described primarily in terms of wafer cooling. However, certain processes, such as sputtering, require wafer heating. The sealing means of the present invention is equally applicable to processes requiring wafer heating, with the cooled platen replaced by a heating element. Furthermore, the present invention has been described in connection with semiconductor wafers. It will be understood that the apparatus of the present invention can be utilized in connection with any thin workpiece processed in vacuum.

While there has been shown and described what is at present considered the preferred embodiments of the present invention, it will be understood by those skilled in the art that various changes and modifications may be made therein without departing from the scope of the present invention as defined by the appended claims.

What is claimed is:

1. Apparatus for thermal transfer with a thin, flexible workpiece during processing in a vacuum chamber, comprising:

platen means including a platen surface for supporting said workpiece in a processing position with a surface exposed to said vacuum chamber;

means for clamping said workpiece to said platen surface;

means for introduction of a gas at a prescribed pressure into a thermal transfer region between said workpiece and said platen surface; and means for inhibiting flow of said gas from said thermal transfer region to said vacuum chamber comprising an elastomer ring having an elongated cross-section and a sealing groove in said platen surface near the periphery of said wafer and surrounding said thermal transfer region, said groove including a first groove portion for firmly gripping a first, fixed edge portion of said ring so that a second, movable edge portion of said ring extends above said platen surface and contacts said workpiece, said elongated cross-section having a long dimension oriented at an acute angle to said platen surface, and a second groove portion which receives said second, movable edge portion of said ring by bending deformation thereof when said workpiece is clamped to said platen surface.

2. Apparatus for thermal transfer as defined in claim 1 wherein said movable edge portion of said ring has a cross-section which tapers essentially to a point where said ring contacts said workpiece.

3. Apparatus for thermal transfer as defined in claim 1 wherein said elongated cross section of said ring has a parallogram shape.

4. Apparatus for thermal transfer as defined in claim 3 wherein said first groove portion includes parallel sidewalls spaced to firmly grip opposite sides of said ring, said sidewalls being oriented at said acute angle to said platen surface.

5. Apparatus for thermal transfer as defined in claim 4 wherein said second groove portion includes a groove generally perpendicular to said platen surface and located adjacent the open end of said first groove portion.

6. Apparatus for thermal transfer as defined in claim 5 wherein said clamping means includes a clamping ring for clamping said workpiece near its periphery.

7. Apparatus for thermal transfer as defined in claim 6 wherein said means for introduction of a gas includes a second annular groove in said surface inward of said sealing groove, and means for supplying gas to said second annular groove.

8. Apparatus for thermal transfer as defined in claim 1 wherein said platen surface is nonplanar for stressing of said workpiece so as to offset the pressure of the gas in said thermal transfer region.

9. Apparatus for thermal transfer as defined in claim 1 wherein said platen surface is generally flat with a central cavity for introduction of gas at the prescribed pressure.

10. Apparatus for thermal transfer as defined in claim 1 further including cooling means for removing thermal energy transferred to said platen surface from said workpiece.

11. Apparatus for thermal transfer as defined in claim 1 wherein said workpiece is a semiconductor wafer.

12. Apparatus for thermal transfer as defined in claim 1 wherein thermal energy is transferred to said workpiece in said vacuum chamber by an energetic ion beam.

* * * * *